United States Patent [19]

Arvanitis et al.

[11] 3,947,784

[45] Mar. 30, 1976

[54] DUAL-COUPLED MONOLITHIC CRYSTAL ELEMENT FOR MODIFYING RESPONSE OF FILTER

[75] Inventors: Aristotelis Arvanitis, Addison; Stanley Malinowski, Park Ridge, both of Ill.; Craig P. Smith, deceased, late of Addison, Ill., Paul N. Page, administrator, Arlington Heights, Ill.

[73] Assignee: Motorola, Inc., Chicago, Ill.

[22] Filed: Sept. 19, 1974

[21] Appl. No.: 507,317

[52] U.S. Cl. .................. 333/72; 333/74; 333/76
[51] Int. Cl.². ... H03H 9/04; H03H 9/26; H03H 9/32
[58] Field of Search ............... 333/72, 76, 71, 74; 310/8.1, 8.2, 8.3, 9.8

[56] References Cited
UNITED STATES PATENTS

| | | |
|---|---|---|
| 3,569,873 | 3/1971 | Beaver ................................ 333/72 |
| 3,576,506 | 4/1971 | Reynolds et al. ................. 333/72 |
| 3,602,844 | 8/1971 | Sykes ............................ 333/72 X |
| 3,656,180 | 4/1972 | Braun ............................ 333/72 X |

*Primary Examiner*—Alfred E. Smith
*Assistant Examiner*—Marvin Nussbaum
*Attorney, Agent, or Firm*—James W. Gillman; Victor Myer

[57] ABSTRACT

A dual-coupled monolithic crystal element is connected to a crystal filter to bypass signals of a predetermined frequency which are applied through the filter. The shunt connected crystal element can be used with a bandpass filter to bypass frequencies at which the crystal filter produces a spurious response so that such frequencies will not appear in the filter output. Alternatively, the monolithic element can be selected to bypass frequencies adjacent the edges of a band which is selected, to provide sharp attenuation at the edges of the band thereby providing a very steep filter characteristic. The monolithic element includes a flat quartz wafer with electrodes provided on both sides at two separate portions of the wafer to form two resonant portions coupled through the wafer. The electrodes of one portion are connected across the input or the output of the crystal filter, and both electrodes of the other resonating portions are grounded.

9 Claims, 4 Drawing Figures

DUAL-COUPLED MONOLITHIC CRYSTAL ELEMENT FOR MODIFYING RESPONSE OF FILTER

BACKGROUND OF THE INVENTION

Crystal filters have been provided having different frequency response characteristics, such as a bandpass response, as required for various different applications. Although such crystal filters can provide very sharp selectivity, the crystal may have spurious responses which result in unacceptable frequency attenuation levels in the reject region of the filter. In an attempt to overcome this problem, additional crystals may be added to the filter. However, this makes the crystal filter design much more complex and may produce other problems.

Bandpass crystal filters have been provided using dual coupled monolithic crystal resonators, but such filters have not had sufficient attenuation at frequencies adjacent the filter passband for use in some applications. To provide a filter of a different known design, with additional crystal elements to overcome the problems, would result in a complex and expensive crystal filter configuration.

SUMMARY OF THE INVENTION

It is an object of the present invention to provide a dual-coupled monolithic crystal resonator connected to a crystal filter to bypass a predetermined frequency band, to thereby modify the frequency response of the crystal filter.

Another object of the invention is to provide a dual-coupled monolithic crystal resonator with a crystal filter, to bypass a predetermined frequency band at which sufficient attenuation of signals is not produced by the filter because of spurious responses of the crystals thereof.

A further object of the invention is to provide a bandpass crystal filter with a dual-coupled monolithic crystal resonator constructed and connected to short circuit frequencies adjacent the bandpass of the crystal filter to provide an overall frequency characteristic having high selectivity at the edges of the band.

In accordance with the invention, filters which satisfy desired frequency attenuation requirements adjacent the passband, but which have a frequency range in which the filter fails to satisfy requirements because of spurious responses, can be modified by connecting a dual coupled monolithic crystal resonator across the input of the filter so that signals at the frequencies at which the filter provides insufficient attenuation are shorted or bypassed and are not passed to the filter output. This makes it possible to provide the desired frequency response while retaining a relatively simple filter configuration. The spurious response may be at frequencies displaced from the bandpass of the filter or may be closely adjacent to the bandpass of the filter. The use of two dual-coupled monolithic crystal resonators having frequencies closely adjacent to the bandpass, acts to deepen the sides of the bandpass response and to remove undesired responses closely adjacent the bandpass.

DETAILED DESCRIPTION

Figure 1:
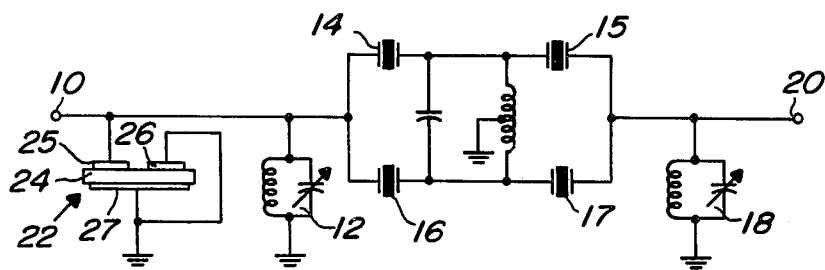
FIG. 1 shows a circuit diagram of a filter circuit in accordance with the invention.

Referring now to the drawing, FIG. 1 shows one application of the dual-coupled monolithic crystal resonator of the invention. In FIG. 1 there is shown a crystal filter of the bandpass type, with the bandwidth at 60 db to the bandwidth at 3db having a shape factor greater than 1.2:1. This crystal filter has an input terminal 10 from which signals are applied to the input tuned circuit 12. The crystal filter proper includes crystals 14, 15, 16 and 17 which are connected in a bridge or lattice configuration. A parallel circuit including bifilar coil 19 having a grounded center tap bridged by capacitor 31 is connected from the junction between crystals 14 and 15 to the junction between crystals 16 and 17. The selected signals are applied across output tuned circuit 18 and to output terminal 20. The filter which has been described is of known configuration.

Figure 2:
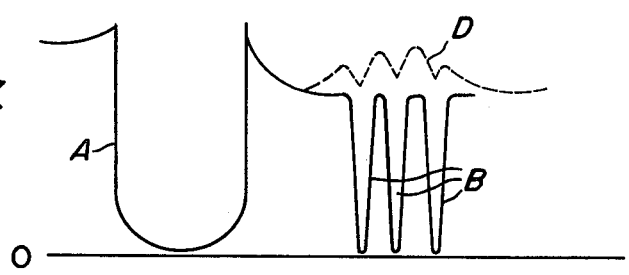
FIG. 2 illustrates the response of the filter of FIG. 1.

FIG. 2 shows by solid line A the response curve of the filter of FIG. 1. This has a bandpass response which can be provided at a desired frequency band by selection of the frequency characteristics of the crystals. In addition to the bandpass response characteristic, spurious responses of the crystals provide points or dips B in the filter characteristic at which the attenuation or rejection provided by the filter drops to very low values. This will cause the filter to pass signals at these particular frequencies, which is objectionable.

In FIG. 1 there is connected, ahead of the filter which has been described, a single monoliithic element 22 which includes a quartz wafer 24 having electrodes 25, 26 and 27 thereon. The electrode 25 and the portion of the electrode 27 opposite thereto form a first resonating portion which is connected between the input terminal 10 and the reference potential or ground. A second resonating portion is formed by the wafer 24, the electrode 26 and the portion of electrode 27 opposite the electrode 26. Both electrodes of this second resonating portion are connected to the reference potential or ground. The first and second resonating portions are mechanically coupled through the wafer.

The monolithic resonating element 22 provides low impedance over a band of frequencies, which can be selected at a predetermined frequency band by control of the dimensions of the wafer and the electrodes. The overall response of the resonating element 22 is shown by curve C in FIG. 2. The element 22 is connected to form a hunt or bypass circuit which bypasses frequencies in the predetermined frequency band. By selecting this band to encompass the frequencies which are not sufficiently attenuated or rejected by the crystal filter including crystals 14, 15, 16 and 17, signals of these frequencies are not passed to the filter being shunted by the bypass circuit. This will provide a combined response as shown in FIG. 2 by the portion A and the dashed portion D. Accordingly, signals of the frequencies which are passed by the dips B in the response curve of the crystal filter will be substantially removed by the bypass circuit so that they will not appear at the output 20 of the crystal filter.

Figure 3:
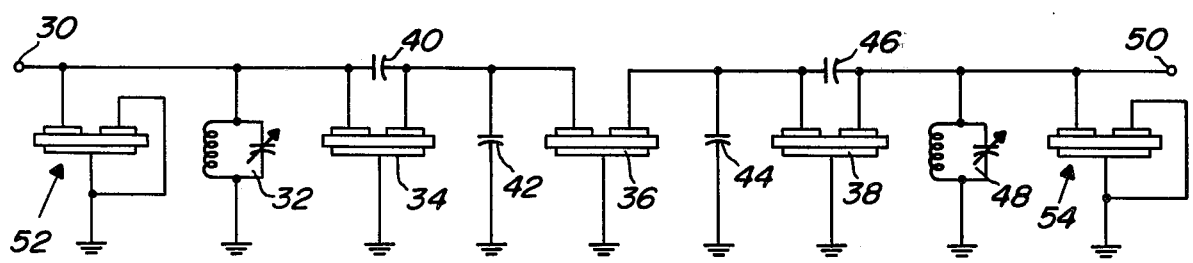
FIG. 3 shows a filter circuit of a second embodiment of the invention.

FIG. 3 shows the use of the dual-coupled monolithic crystal resonators in connection with a crystal filter of the sideband type with the bandwidth at 60 db to the bandwidth at 2 db having a shape factor less that 1.2.:1.

The crystal filter in this circuit uses all dual-coupled monolithic crystal resonators and provides a symmetrical bandpass response. Signals applied to the input terminal 30 are developed across tuned circuit 32 and applied to three dual-coupled monolithic crystal resonators 34, 36 and 38 which are connected in series. Each resonator has two resonating portions, with the signal being applied to the electrode of one portion and taken off from an electrode of the second portion. The resonators each has an electrode which is common to both portions thereof and which is connected to the reference potential or ground. The crystal filter of FIG. 3 is of known construction and may include a capacitor 40 bridging the two resonating portions of the resonator 34, and a capacitor 42 coupling the output portion of resonator 34 and the input portion of resonator 36. A similar coupling capacitor 44 is provided between the output portion of resonator 36 and the input portion of resonator 38, and the two portions of resonator 38 are bridged by capacitor 46. The signal from the output portion of resonator 38 is applied to tuned circuit 48, and the signal developed across the tuned circuit 48 is applied to output terminal 50.

Figure 4:
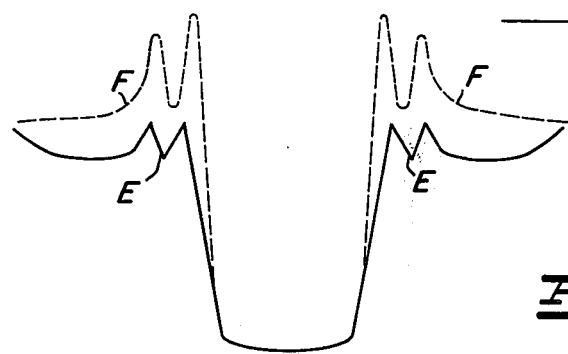
FIG. 4 shows the response curve of the circuit of FIG. 3.

As previously stated, the crystal filter which has been described in FIG. 3 is of known construction and provides a response characteristic as shown by the solid line curve in FIG. 4. The filter provides a bandpass response which is substantially symmetrical. It is noted that the response has dips E adjacent the passband which fall below the desired attenuation level.

In FIG. 3, the dual-coupled monolithic crystal resonators 52 and 54 are connected between the input terminal 30 and the reference potential, and between the output terminal 50 and the reference potential, respectively. Each of these elements is of the same construction as the element 22 in FIG. 1, with a first resonating portion having electrodes connected to the signal conductor and the reference potential, and a second portion having electrodes both of which are connected to the reference potential, coupled through the wafer to the first portion. Each of the resonators 52 and 54 provides a low impedance over a band of frequencies, as shown by the curve C of FIG. 2. By selecting the dimensions of the wafers and the electrodes of the resonators 52 and 54, the frequency bands at which the low impedance occurs can be selected to be adjacent the edges of the passband of the filter of FIG. 3, so that the response characteristics is changed to that shown by the dashed lines F in FIG. 4. This will bypass the signals adjacent the edges of the passband to provide greater attenuation in these regions and sharpen the sides of the bandpass characteristic. This is shown by the dotted portions F applied to the response curve in FIG. 4.

The use of dual-coupled monolithic crystal elements as illustrated and described makes it possible to provide desired filter characteristics by a very simple means. The use of such an element in a band pass filter to remove spurious responses is more effective than the use of a more complex filter design to eliminate such responses, as less crystal elements are required and the insertion loss is not substantially increased. In the sideband filter, the monolithic crystal elements act to steepen the sides of the response curve and to increase the attenuation of undesired responses, without use of a complex filter configuration and with no substantial increase in insertion loss. The dual-coupled monolithic crystal elements can also be advantageously used in other crystal filter applications.

We claim:

1. A shunt circuit for use with an electrical filter having an input signal conductor, an output signal conductor, a reference potential and which has a predetermined response characteristic, for bypassing signals of a predetermined frequency band which are applied between said signal conductor and said reference potential, including in combination,
    a piezoelectric element including a body of material having piezoelectric characteristics with first and second coupled portions,
    electrode means on said body forming first and second pairs of electrodes associated with said first and second portions, respectively, said electrodes of each of said pairs being positioned on opposite sides of said body,
    first conductor means connecting said electrodes of said first pair between said input signal conductor and said reference potential, and
    second conductor means connecting both of said electrodes of said second pair of electrodes to said reference potential.

2. The circuit of claim 1 wherein said piezoelectric element is a monolithic crystal resonator including a flat body made of quartz.

3. The circuit of claim 2 wherein said electrode means includes first and second spaced electrodes on one side of said flat body and a third electrode on said body opposite said first and second electrodes, with said first electrode and a portion of said third electrode forming said first pair of electrodes, and said second electrode and a portion of said third electrode forming said second pair of electrodes.

4. A circuit for use with an electrical filter coupled between an input signal conductor an output signal conductor and a reference potential, and which includes at least one crystal and has a desired frequency pass characteristic and an undesired pass characteristic at a predetermined frequency resulting from spurious responses of the crystal, such circuit passing undesired signals at said predetermined frequency and including in combination,
    a piezoelectric element including a wafer of material having piezoelectric characteristics which forms first and second mechanically coupled portions, and a pair of conducting electrodes on opposite sides of said wafer at each of said portions,
    conductor means connecting said electrodes on said first portion between said input signal conductor and the reference potential, and connecting both of said electrodes on said second portion to said reference potential,
    said piezoelectric element and said conductor means forming a resonator which has low impedance at said predetermined frequency which has low impedance at said predetermined frequency which bypasses the undesired signals at said predetermined frequency.

5. The circuit of claim 4 wherein said piezoelectric element is a monolithic resonator including a flat body made of quartz.

6. The circuit of claim 5 wherein said pair of conducting electrodes on said first portion of said wafer includes a first electrode on one side of said flat body and a portion of electrode means on the opposite side of said flat body, and said pair of conducting electrodes on said second portion of said wafer includes a second electrode on said one side of said flat body and a different portion of said electrode means on said opposite side of said body.

7. A circuit for use with an electrical filter having an input signal conductor and an output signal conductor and which is coupled to a reference potential, and which includes at least one crystal and has a desired bandpass characteristic and undesired pass characteristics at first and second predetermined frequencies adjacent the opposite edges of the desired passband, such circuit bypassing signals at said predetermined frequencies and including in combination, first and second piezoelectric elements each including a wafer of material having piezoelectric characteristics which forms first and second mechanically coupled portions, a pair fo conducting electrodes on each of said portions and cooperating with said wafer to form a resonator, and means connecting said electrodes on said second portions of said elements to the reference potential, said first piezoelectric element being constructed so that said pair of electrodes on said first portion thereof present a low impedance at the first predetermined frequency, and said second piezoelectric element being constructed so that said pair of electrodes on said first portion thereof present a low impedance at the second predetermined frequency, first conductor means connecting said electrodes on said first portion of said first element between the input signal conductor and the reference potential, and second conductor means connecting said electrodes on said first portion of said second element between the output signal conductor and the reference potential.

8. The circuit of claim 7 wherein each of said piezoelectric elements includes a monolithic resonator including a flat body made of quartz.

9. The circuit of claim 8 wherein each of said piezoelectric elements includes electrode means on one side of said flat body, and said pair of conducting electrodes on said first portion of said wafer includes a portion of electrode means and a first electrode on the opposite side of said flat body, and said pair of conducting electrodes on said second portion of said wafer includes a different portion of said electrode means and a second electrode on said opposite side of said body.

* * * * *